United States Patent
Iwai

(10) Patent No.: US 8,976,603 B2
(45) Date of Patent: Mar. 10, 2015

(54) NONVOLATILE SEMICONDUCTOR MEMORY DEVICE

(71) Applicant: Kabushiki Kaisha Toshiba, Minato-ku (JP)

(72) Inventor: Hitoshi Iwai, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/263,868

(22) Filed: Apr. 28, 2014

(65) Prior Publication Data

US 2014/0233323 A1   Aug. 21, 2014

Related U.S. Application Data

(63) Continuation of application No. 13/870,137, filed on Apr. 25, 2013, now Pat. No. 8,830,765, which is a continuation of application No. 13/233,407, filed on Sep. 15, 2011, now Pat. No. 8,446,780.

(30) Foreign Application Priority Data

Sep. 22, 2010   (JP) ................................ 2010-211865

(51) Int. Cl.

| | |
|---|---|
| G11C 16/04 | (2006.01) |
| G11C 16/14 | (2006.01) |
| H01L 27/115 | (2006.01) |
| H01L 29/792 | (2006.01) |
| G11C 16/10 | (2006.01) |

(52) U.S. Cl.
CPC ............ *G11C 16/14* (2013.01); *G11C 16/0483* (2013.01); *H01L 27/11578* (2013.01); *H01L 27/11582* (2013.01); *H01L 29/7926* (2013.01); *G11C 16/10* (2013.01)

USPC ............ 365/185.29; 365/185.17; 365/185.18; 365/185.24

(58) Field of Classification Search
CPC .... G11C 16/0483; G11C 16/10; G11C 16/26; G11C 16/08; G11C 16/16; G11C 16/24; G11C 7/00; G11C 8/08
USPC ............. 365/185.29, 185.17, 185.18, 185.11, 365/185.24
See application file for complete search history.

(56) References Cited

U.S. PATENT DOCUMENTS

| | | | |
|---|---|---|---|
| 8,446,780 B2 * | 5/2013 | Iwai ......................... | 365/185.29 |
| 2007/0252201 A1 | 11/2007 | Kito et al. | |

(Continued)

FOREIGN PATENT DOCUMENTS

JP   2010-211326   9/2010

*Primary Examiner* — Hien Nguyen
(74) *Attorney, Agent, or Firm* — Oblon, McClelland, Maier & Neustadt, L.L.P.

(57) ABSTRACT

A control circuit is configured to, during an erase operation, set a voltage of a first line connected to a selected cell unit to a voltage larger than a voltage of a gate of a first transistor included in the selected cell unit by an amount of a first voltage. The control circuit is configured to, during the erase operation, set a voltage difference between a voltage of a first line connected to an unselected cell unit and a voltage of a gate of a first transistor included in the unselected cell unit to a second voltage, the second voltage differing from the first voltage. In addition, the control circuit is configured to, during the erase operation, apply in the selected cell unit and the unselected cell unit a third voltage to a gate of at least one of dummy memory transistors in a dummy memory string, and apply a fourth voltage to a gate of another one of the dummy memory transistors in the dummy memory string, the fourth voltage being lower than the third voltage.

14 Claims, 15 Drawing Sheets

(56) References Cited

U.S. PATENT DOCUMENTS

| | | |
|---|---|---|
| 2011/0157989 A1 | 6/2011 | Iwata |
| 2012/0057405 A1 | 3/2012 | Ogiwara et al. |
| 2012/0069660 A1 | 3/2012 | Iwai et al. |

* cited by examiner

NONVOLATILE SEMICONDUCTOR MEMORY DEVICE

CROSS-REFERENCE TO RELATED APPLICATIONS

This application is a continuation of U.S. application Ser. No. 13/870,137, filed Apr. 25, 2013, which is a continuation of U.S. application Ser. No. 13/233,407, filed Sep. 15, 2011, now U.S. Pat. No. 8,446,780, which is based upon and claims the benefit of priority from the prior Japanese Patent Application No. 2010-211865, filed on Sep. 22, 2010, the entire contents of each of which are incorporated herein by reference.

FIELD

Embodiments described in the present specification relate to an electrically data rewritable nonvolatile semiconductor memory device.

BACKGROUND

In recent years, many semiconductor memory devices having memory cells disposed three-dimensionally are proposed as a way of increasing a degree of integration of memory. For example, one conventional kind of semiconductor memory device having memory cells three-dimensionally disposed employs a transistor having a cylindrical column-shaped structure.

There is a risk that, when an erase operation is executed on a semiconductor memory device of the above-described kind, the erase operation is not executed accurately due to a leak current flowing into the memory cells from various kinds of wiring lines.

DETAILED DESCRIPTION

Figure 1:
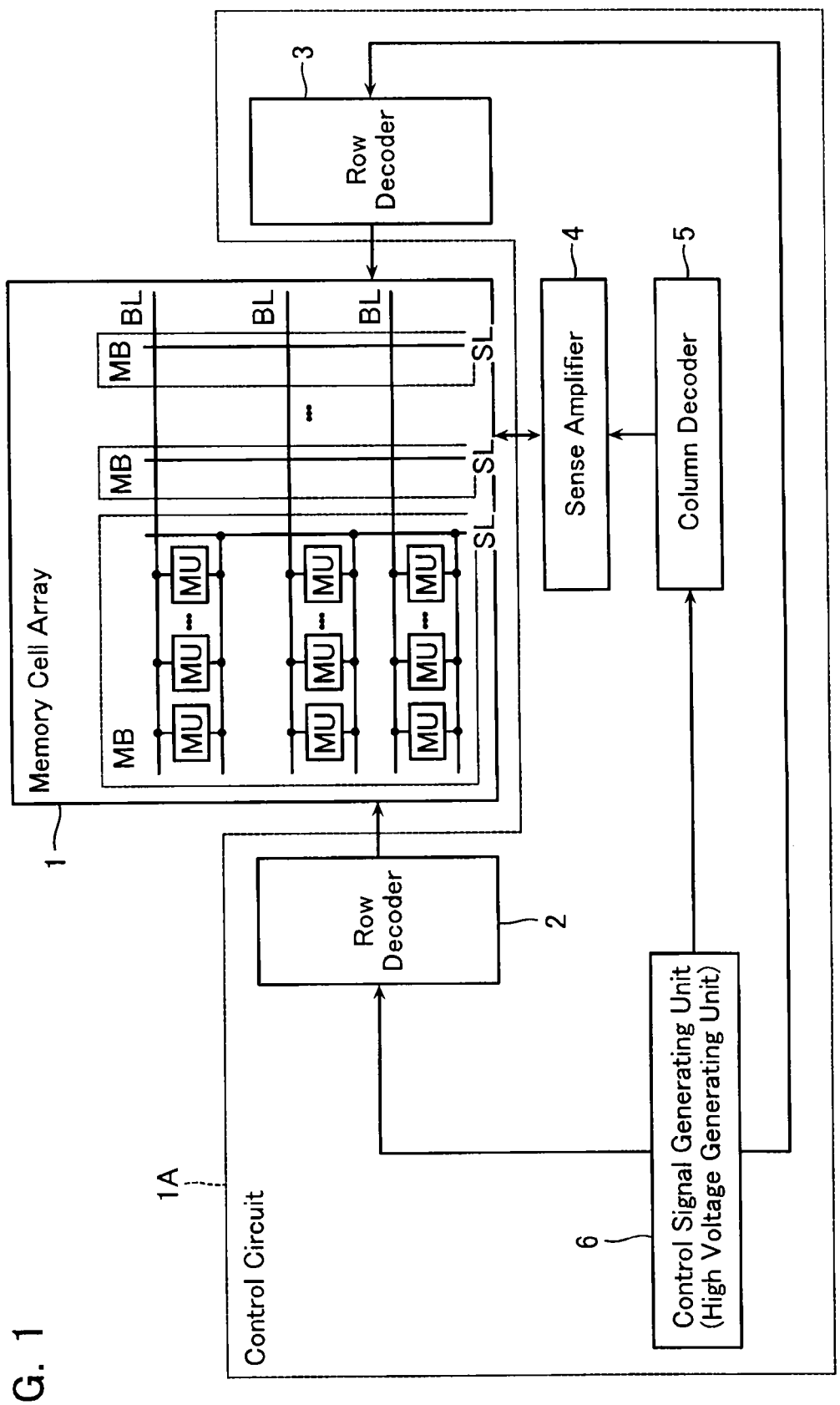
FIG. 1 is a block diagram of a nonvolatile semiconductor memory device according to a first embodiment.

A nonvolatile semiconductor memory device according to an embodiment comprises a cell unit, a first line, and a control circuit. The cell unit includes a plurality of memory transistors. The first line is connected to one end of the cell unit. The control circuit is configured to control a voltage applied to the cell unit. The cell unit comprises a memory string, a dummy memory string, and a first transistor. The memory string has a plurality of electrically rewritable memory transistors connected in series. The dummy memory string has one end connected to one end of the memory string, and has a plurality of dummy memory transistors connected in series. The first transistor is provided between the other end of the dummy memory string and the first line. The memory string comprises a semiconductor layer, a charge storage layer, and a first conductive layer. The semiconductor layer includes a columnar portion extending in a perpendicular direction to a substrate and functions as a body of the memory transistors. The charge storage layer surrounds a side surface of the columnar portion and stores a charge. The first conductive layer surrounds a side surface of the columnar portion via the charge storage layer and functions as a gate of the memory transistors. The dummy memory string comprises the semiconductor layer, the charge storage layer, and a second conductive layer. The semiconductor layer functions as a body of the dummy memory transistors. The second conductive layer surrounds a side surface of the columnar portion via the charge storage layer and functions as a gate of the dummy memory transistors. The control circuit is configured to, during an erase operation, set a voltage of the first line connected to a selected cell unit to a voltage larger than a voltage of a gate of the first transistor included in the selected cell unit by an amount of a first voltage. The control circuit is configured to, during the erase operation, set a voltage difference between a voltage of the first line connected to an unselected cell unit and a voltage of a gate of the first transistor included in the unselected cell unit to a second voltage, the second voltage differing from the first voltage. In addition, the control circuit is configured to, during the erase operation, apply in the selected cell unit and the unselected cell unit a third voltage to a gate of at least one of the dummy memory transistors in the dummy memory string, and apply a fourth voltage to a gate of another one of the dummy memory transistors in the dummy memory string, the fourth voltage being lower than the third voltage.

A nonvolatile semiconductor memory device according to an embodiment comprises a cell unit, a first line, and a control circuit. The cell unit includes a plurality of memory transistors. The first line is connected to one end of the cell unit. The control circuit is configured to control a voltage applied to the cell unit. The cell unit comprises a memory string and a first transistor. The memory string has a plurality of electrically rewritable memory transistors connected in series. The first transistor is provided between one end of the memory string and the first line. The memory string comprises a semiconductor layer, a charge storage layer, and a first conductive layer. The semiconductor layer includes a columnar portion extending in a perpendicular direction to a substrate and functions as a body of the memory transistors. The charge storage layer surrounds a side surface of the columnar portion and stores a charge. The first conductive layer surrounds a side surface of the columnar portion via the charge storage layer and functions as a gate of the memory transistors. The control circuit is configured to, during an erase operation, set a voltage of the first line connected to a selected cell unit to a voltage larger than a voltage of a gate of the first transistor included in the selected cell unit by an amount of a first voltage. The control circuit is configured to, during the erase operation, set a voltage difference between a voltage of the first line connected to an unselected cell unit and a voltage of a gate of the first transistor included in the unselected cell unit to a second voltage, the second voltage differing from the first voltage. In addition, the control circuit is configured to, during the erase operation, execute a first process and a second process. The first process is a process in which, in the selected memory cell unit and the unselected memory cell unit, a third voltage is applied to a gate of at least one of the memory transistors in the memory string, and a fourth voltage is applied to a gate of another one of the memory transistors in the memory string, the fourth voltage being lower than the third voltage. The second process is a process in which the fourth voltage is applied to the gate of the memory transistors applied with the third voltage in the first process, and the third voltage is applied to the gate of the memory transistors applied with the fourth voltage in the first process.

An embodiment of a nonvolatile semiconductor memory device is described be low with reference to the drawings.

[First Embodiment]

[Configuration]

First, a configuration of a nonvolatile semiconductor memory device according to a first embodiment is described with reference to FIGS. 1 and 2. As shown in FIG. 1, the nonvolatile semiconductor memory device according to the first embodiment includes a memory cell array 1 and a control circuit 1A.

Figure 3:
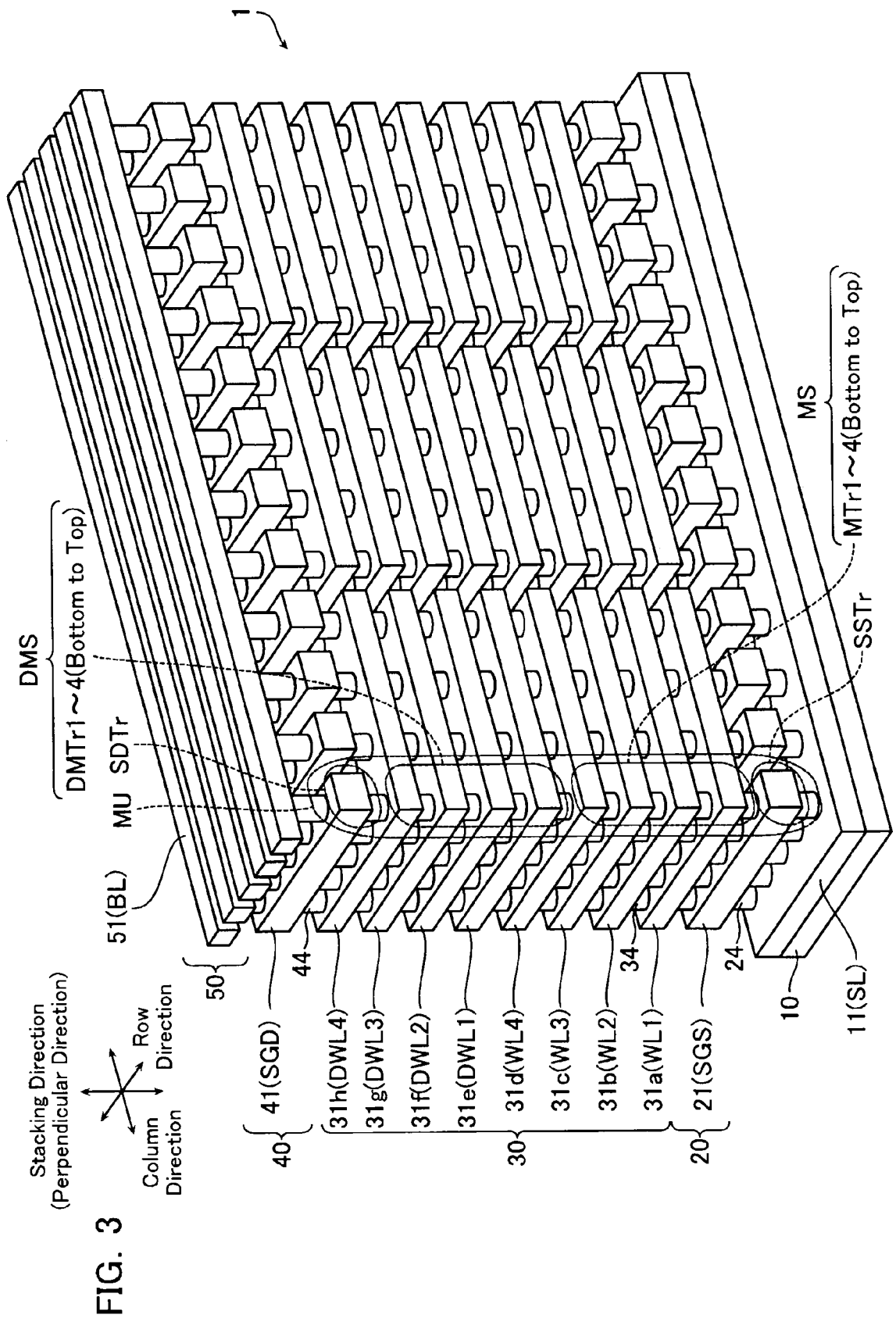
FIG. 3 is a schematic perspective view of the nonvolatile semiconductor memory device according to the first embodiment.

As shown in FIG. 1, the memory cell array 1 includes a plurality of memory blocks MB. Furthermore, each memory block MB includes a plurality of cell units MU, a bit line BL, and a source line SL. The cell unit MU is selected when an erase operation for erasing data is executed. As shown in FIG. 3 mentioned later, the cell unit MU is disposed having its longer direction as a stacking direction. That is, the cell unit MU is arranged three-dimensionally. The bit line BL is connected to a drain side of the cell unit MU. The source line SL is connected to a source side of the cell unit MU.

The control circuit 1A controls a voltage applied to the memory cell array 1 (cell unit MU). As shown in FIG. 1, the control circuit 1A comprises row decoders 2, 3, a sense amplifier 4, a column decoder 5, and a control signal generating unit (high voltage generating unit) 6.

The row decoders 2, 3 decode a block address signal and so on downloaded to the row decoders 2, 3, and control the memory cell array 1. The sense amplifier 4 reads data from the memory cell array 1. The column decoder 5 decodes a column address signal and controls the sense amplifier 4. The control signal generating unit 6 boosts a base voltage to generate a high voltage required during write and erase, and furthermore, generates a control signal to control the row decoders 2, 3, the sense amplifier 4, and the column decoder 5.

Figure 2:
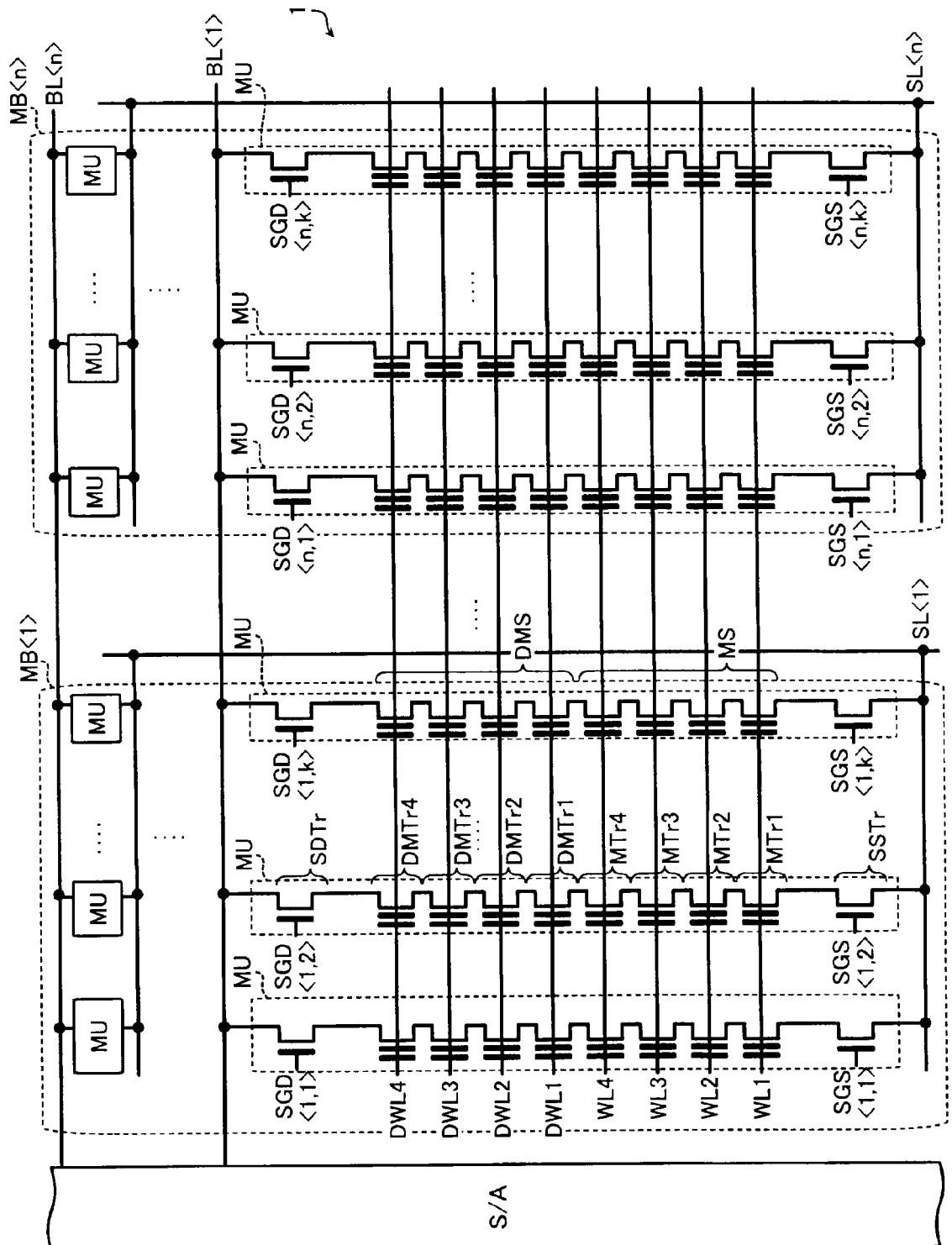
FIG. 2 is a circuit diagram of a memory cell array 1 according to the first embodiment.

Next, a circuit configuration of the memory cell array 1 is described specifically, with reference to FIG. 2. As shown in FIG. 2, the memory cell array 1 includes a plurality of memory blocks MB<1>, ..., MB<n>, a plurality of bit lines BL<1>, ..., BL<n>, and a plurality of source lines SL<1>, ..., SL<n>. Note that when none of the plurality of memory blocks MB<1>, ..., MB<n> is specified, they are collectively termed memory blocks MB. When none of the plurality of bit lines BL<1>, ..., BL<n> is specified, they are collectively termed bit lines BL. When none of the plurality of source lines SL<1>, ..., SL<n> is specified, they are collectively termed source lines SL.

Each memory block MB includes a plurality of cell units MU, and is configured as a smallest unit of the erase operation. The bit lines BL are commonly provided to the memory blocks MB<1>, ..., MB<n>. The bit lines BL are commonly connected to drains of a plurality of cell units MU in one of the memory blocks MB. The source lines SL are each provided so as to be divided on a memory block MB basis. That is, the source lines SL are partitioned on a memory block MB basis, and are provided independently one each to each one of the memory blocks MB. The source lines SL are connected to sources of a plurality of the cell units MU.

In the example shown in FIG. 2, the cell units MU are provided in a matrix along k rows and n columns to each one of the memory blocks MB. Each cell unit MU includes a memory string MS, a dummy memory string DMS, a drain side select transistor SDTr, and a source side select transistor SSTr. The memory string MS is configured by memory transistors MTr1-MTr4 connected in series. The memory transistors MTr1-MTr4 are configured such that changing an amount of charge stored in a charge storage layer of the memory transistors MTr1-MTr4 causes a threshold voltage of the memory transistors MTr1-MTr4 to change. Changing the threshold voltage allows data retained in the memory transistors MTr1-MTr4 to be rewritten.

A source of the dummy memory string DMS is connected to a drain of the memory string MS (drain of the memory transistor MTr4). The dummy memory string DMS is configured by dummy memory transistors DMTr1-DMTr4 connected in series. The dummy memory transistors DMTr1-DMTr4 are not employed in storage of data, but are employed for controlling a voltage of a body of the memory transistors MTr1-MTr4. Note that a function of the dummy memory transistors DMTr1-DMTr4 is described in detail in FIG. 6 mentioned later.

A source of the drain side select transistor SDTr is connected to a drain of the dummy memory string DMS (drain of the dummy memory transistor DMTr4). A drain of the source side select transistor SSTr is connected to a source of the memory string MS (source of the memory transistor MTr1).

As shown in FIG. 2, in the plurality of memory blocks MB, gates of the memory transistors MTr1 arranged in a matrix are commonly connected to a single word line WL1. Similarly, gates of the memory transistors MTr2-MTr4 are commonly connected to single word lines WL2-WL4, respectively.

As shown in FIG. 2, in the memory block MB<1>, gates of the drain side select transistors SDTr arranged in a line in a row direction are commonly connected to a single drain side select gate line SGD<1,1> (or SGD<1,2>, ..., SGD<1,k>). Similarly, in each of the memory blocks MB<n>, gates of the drain side select transistors SDTr arranged in a line in a row direction are commonly connected to a single drain side select gate line SGD<n,1> (or SGD<n,2>, ..., SGD<n,k>). Note that when none of the drain side select gate lines SGD<1,1>, ..., SGD<n,k> is specified, they are collectively termed drain side select gate lines SGD. The drain side select gate lines SGD are each provided extending in the row direction and having a certain pitch in a column direction.

In addition, drains of the drain side select transistors SDTr arranged in a line in the column direction are commonly connected to a single bit line BL1 (or BL2, . . . , BLn). The bit lines BL are formed extending in the column direction straddling the memory blocks MB.

As shown in FIG. 3, in the memory block MB<1>, gates of the source side select transistors SSTr arranged in a line in the row direction are commonly connected to a single source side select gate line SGS<1,1> (or SGS<1,2>, . . . , SGS<1,k>). Similarly, in each of the memory blocks MB<n>, gates of the source side select transistors SSTr arranged in a line in a row direction are commonly connected to a single source side select gate line SGS<n,1> (or SGS<n,2>, . . . , SGS<n,k>). Note that when none of the source side select gate lines SGS<1,1>, . . . , SGS<n,k> is specified, they are collectively termed source side select gate lines SGS. The source side select gate lines SGS are each provided extending in the row direction and having a certain pitch in the column direction.

In addition, all of the source side select transistors SSTr in the memory block MB<1> are commonly connected to a single source line SL<1>. Similarly, all of the source side select transistors SSTr in the memory block MB<n> are commonly connected to a single source line SL<n>.

Figure 4:
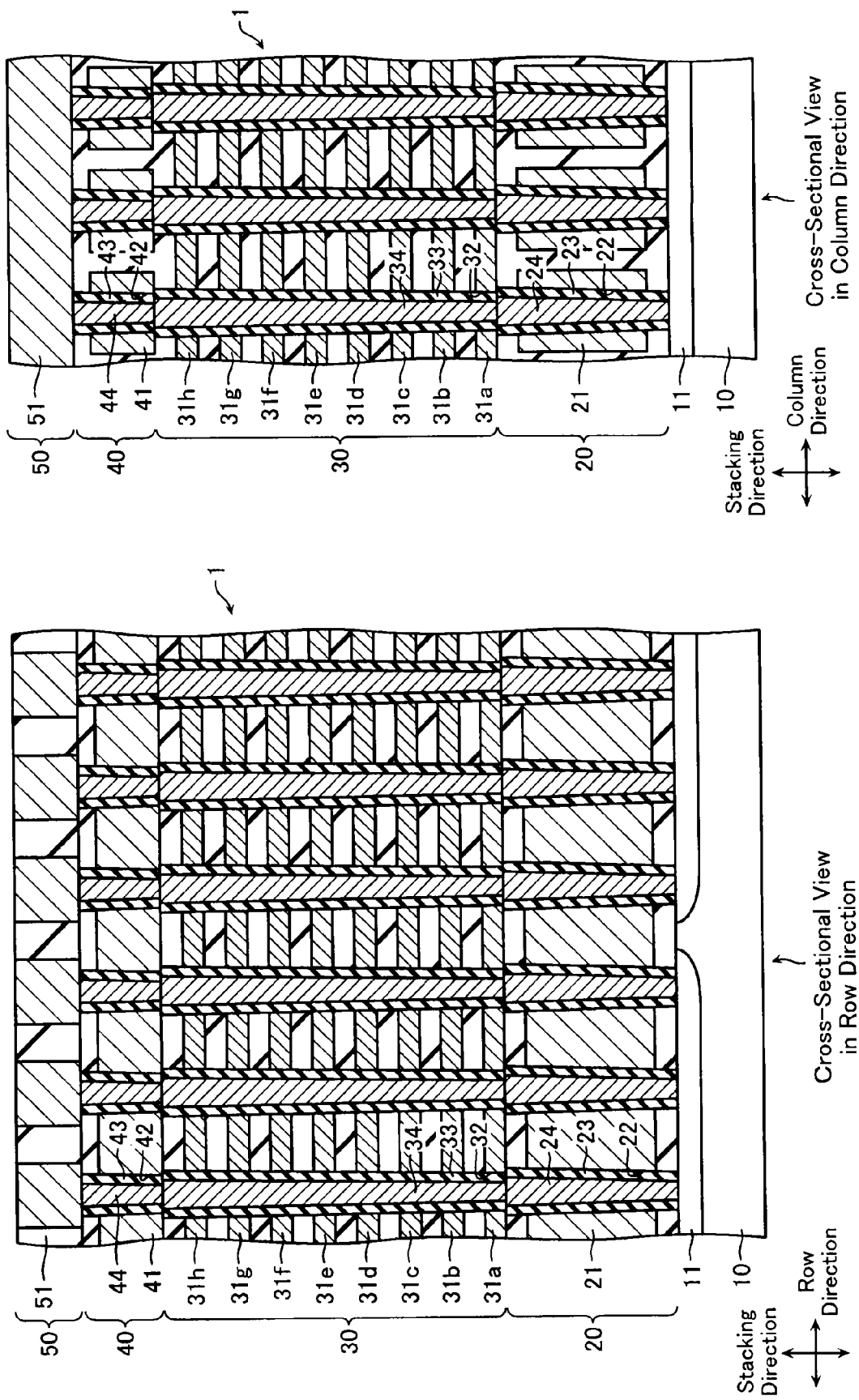
FIG. 4 is a cross-sectional view of the nonvolatile semiconductor memory device according to the first embodiment.

Such an above-described circuit configuration of the memory cell array 1 is realized by a stacking structure shown in FIGS. 3 and 4. As shown in FIGS. 3 and 4, the nonvolatile semiconductor memory device according to the first embodiment includes a semiconductor substrate 10, and, stacked sequentially on the semiconductor substrate 10, a source side select transistor layer 20, a memory layer 30, a drain side select transistor layer 40, and a wiring layer 50.

The semiconductor substrate 10 functions as the source line SL. The source side select transistor layer 20 functions as the source side select transistor SSTr. The memory layer 30 functions as the memory string MS (memory transistors MTr1-MTr4) and the dummy memory string DMS (dummy memory transistors DMTr1-DMTr4). The drain side select transistor layer 40 functions as the drain side select transistor SDTr. The wiring layer 50 functions as the bit line BL, and other various kinds of wiring lines.

The semiconductor substrate 10 includes, on its upper surface, a diffusion layer 11. The diffusion layer 11 functions as the source line SL. The diffusion layer 11 is divided on a memory block MB basis.

As shown in FIGS. 3 and 4, the source side select transistor layer 20 includes a source side conductive layer 21 on the semiconductor substrate 10 via an insulating layer. The source side conductive layer 21 functions as a gate of the source side select transistor SSTr and as the source side select gate line SGS. The source side conductive layer 21 is formed in stripes extending in the row direction and having a certain pitch in the column direction in each memory block MB. The source side conductive layer 21 is configured by polysilicon (poly-Si).

In addition, as shown in FIG. 4, the source side select transistor layer 20 includes a source side hole 22. The source side hole 22 is formed penetrating the source side conductive layer 21. The source side holes 22 are formed in a matrix in the row direction and the column direction.

Moreover, as shown in FIG. 4, the source side select transistor layer 20 includes a source side gate insulating layer 23 and a source side columnar semiconductor layer 24. The source side columnar semiconductor layer 24 functions as a body (channel) of the source side select transistor SSTr.

The source side gate insulating layer 23 is formed with a certain thickness on a side wall of the source side hole 22. The source side columnar semiconductor layer 24 is formed to be in contact with a side surface of the source side gate insulating layer 23 and to fill the source side hole 22. The source side columnar semiconductor layer 24 is formed in a column shape extending in the stacking direction. The source side columnar semiconductor layer 24 is formed on the diffusion layer 11. The source side gate insulating layer 23 is configured by silicon oxide ($SiO_2$). The source side columnar semiconductor layer 24 is configured by polysilicon (poly-Si).

Expressing the above-described configuration of the source side select transistor layer 20 in other words, the source side conductive layer 21 is formed to surround the source side columnar semiconductor layer 24 via the source side gate insulating layer 23.

As shown in FIG. 4, the memory layer 30 includes word line conductive layers 31a-31h stacked sequentially via insulating layers on the source side select transistor layer 20. The word line conductive layers 31a-31d function as gates of the memory transistors MTr1-MTr4 and as the word lines WL1-WL4. The word line conductive layers 31e-31h function as gates of the dummy memory transistors DMTr1-DMTr4 and as dummy word lines DWL1-DWL4.

The word line conductive layers 31a-31h are formed along the plurality of memory blocks MB so as to spread two-dimensionally (in a plate-like shape) in the row direction and the column direction. The word line conductive layers 31a-31h are configured by polysilicon (poly-Si).

In addition, as shown in FIG. 4, the memory layer 30 includes a memory hole 32. The memory hole 32 is formed penetrating the word line conductive layers 31a-31h. The memory holes 32 are formed in a matrix in the row direction and the column direction. The memory hole 32 is formed at a position aligning with the source side hole 22.

Moreover, as shown in FIG. 4, the memory layer 30 includes a memory gate insulating layer 33 and a memory columnar semiconductor layer 34. The memory columnar semiconductor layer 34 functions as a body (channel) of the memory transistors MTr1-MTr4. In addition, the memory columnar semiconductor layer 34 functions as a body (channel) of the dummy memory transistors DMTr1-DMTr4.

The memory gate insulating layer 33 is formed with a certain thickness on a side wall of the memory hole 32. The memory columnar semiconductor layer 34 is formed to be in contact with a side surface of the memory gate insulating layer 33 and to fill the memory hole 32. The memory columnar semiconductor layer 34 is formed in a column shape extending in the stacking direction. The memory columnar semiconductor layer 34 is formed having its lower surface in contact with an upper surface of the source side columnar semiconductor layer 24.

Figure 5:
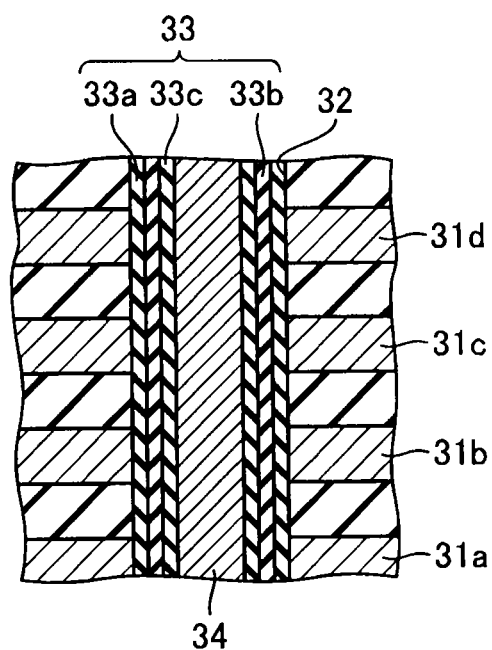
FIG. 5 is an enlarged view of FIG. 4.

A configuration of the memory gate insulating layer 33 is described here in detail with reference to FIG. 5. FIG. 5 is an enlarged view of FIG. 4. The memory gate insulating layer 33 includes, from a side of a side surface of the memory hole 32 to a side of the memory columnar semiconductor layer 34, a block insulating layer 33a, a charge storage layer 33b, and a tunnel insulating layer 33c. The charge storage layer 33b is configured capable of storing a charge.

As shown in FIG. 5, the block insulating layer 33a is formed with a certain thickness on a side wall of the memory hole 32. The charge storage layer 33b is formed with a certain thickness on a side wall of the block insulating layer 33a. The tunnel insulating layer 33c is formed with a certain thickness on a side wall of the charge storage layer 33b. The block insulating layer 33a and the tunnel insulating layer 33c are configured by silicon oxide ($SiO_2$). The charge storage layer 33b is configured by silicon nitride (SiN). The memory columnar semiconductor layer 34 is configured by polysilicon (poly-Si).

Expressing the above-described configuration of the memory layer 30 in other words, the word line conductive layers 31a-31h are formed to surround the memory columnar semiconductor layer 34 via the memory gate insulating layer 33.

As shown in FIGS. 3 and 4, the drain side select transistor layer 40 includes a drain side conductive layer 41. The drain side conductive layer 41 functions as a gate of the drain side select transistor SDTr and as the drain side select gate line SGD.

The drain side conductive layer 41 is stacked via an insulating layer on the memory layer 30. The drain side conductive layer 41 is formed directly above the memory columnar semiconductor layer 34. The drain side conductive layer 41 is formed in stripes extending in the row direction and having a certain pitch in the column direction in each memory block MB. The drain side conductive layer 41 is configured by, for example, polysilicon (poly-Si).

In addition, as shown in FIG. 4, the drain side select transistor layer 40 includes a drain side hole 42. The drain side hole 42 is formed penetrating the drain side conductive layer 41. The drain side holes 42 are formed in a matrix in the row direction and the column direction. The drain side hole 42 is formed at a position aligning with the memory hole 32.

Moreover, as shown in FIG. 4, the drain side select transistor layer 40 includes a drain side gate insulating layer 43 and a drain side columnar semiconductor layer 44. The drain side columnar semiconductor layer 44 functions as a body (channel) of the drain side select transistor SDTr.

The drain side gate insulating layer 43 is formed with a certain thickness on a side wall of the drain side hole 42. The drain side columnar semiconductor layer 44 is formed to be in contact with the drain side gate insulating layer 43 and to fill the drain side hole 42. The drain side columnar semiconductor layer 44 is formed in a column shape extending in the stacking direction. The drain side columnar semiconductor layer 44 is formed having its lower surface in contact with an upper surface of the memory columnar semiconductor layer 34. The drain side gate insulating layer 43 is configured by silicon oxide ($SiO_2$). The drain side columnar semiconductor layer 44 is configured by polysilicon (poly-Si).

Expressing the above-described configuration of the drain side select transistor layer 40 in other words, the drain side conductive layer 41 is formed to surround the drain side columnar semiconductor layer 44 via the drain side gate insulating layer 43.

As shown in FIGS. 3 and 4, the wiring layer 50 includes a bit layer 51. The bit layer 51 functions as the bit line BL.

The bit layer 51 is formed in contact with an upper surface of the drain side columnar semiconductor layer 44. The bit layer 51 is formed extending in the column direction and having a certain pitch in the row direction. The bit layer 51 is configured by a metal such as tungsten.

Figure 6:
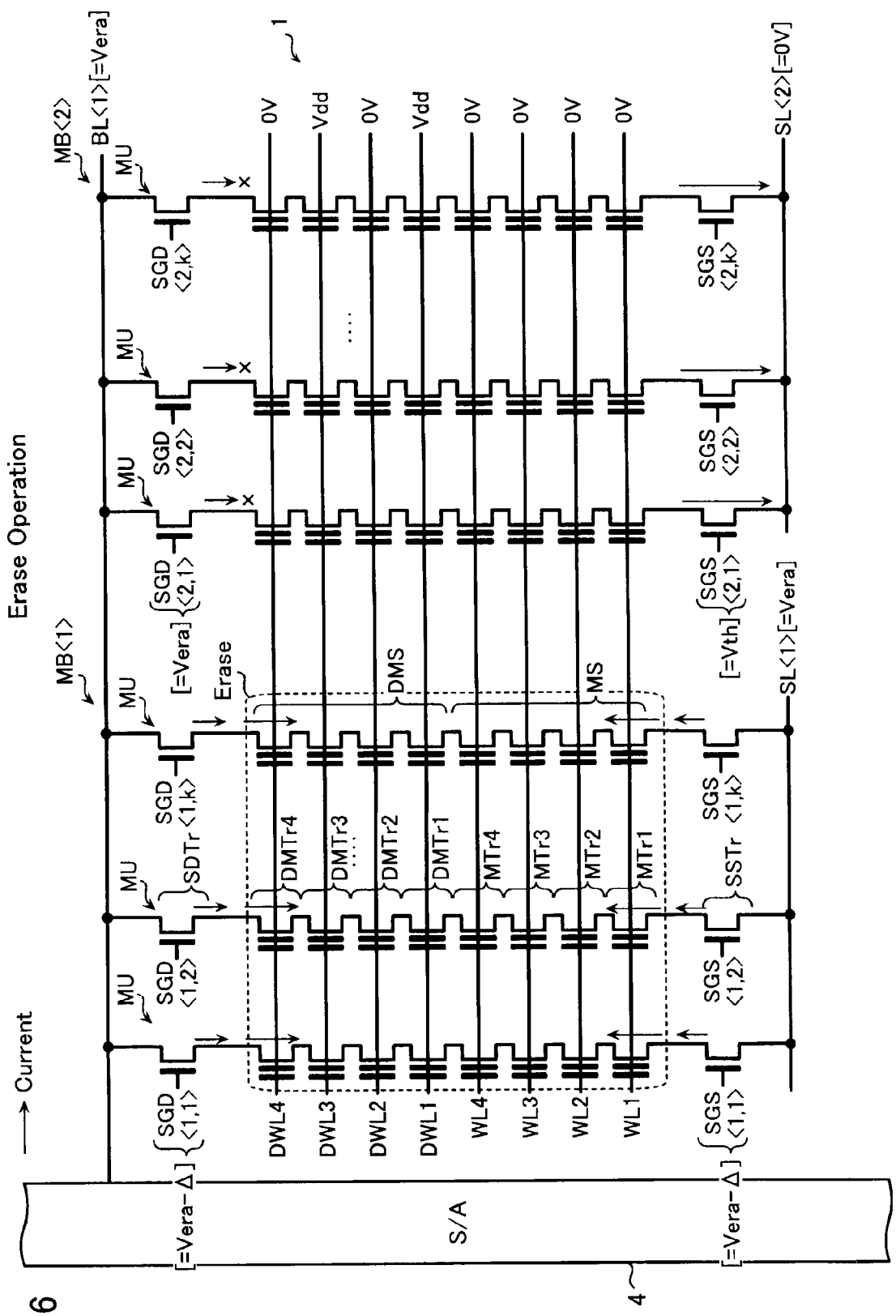
FIG. 6 is a schematic view showing an erase operation in the nonvolatile semiconductor memory device according to the first embodiment.

Next, an erase operation in the nonvolatile semiconductor memory device according to the first embodiment is described with reference to FIG. 6. In FIG. 6, description proceeds, as an example, assuming that data in the memory transistors MTr1-MTr4 in memory block MB<1> (selected memory block) is selectively erased, while memory block MB<2> (unselected memory block) is not selected and erase of data in the memory transistors MTr1-MTr4 in memory block MB<2> is prohibited. That is, all of the cell units MU (selected cell units) in memory block MB<1> are selected and their data is erased. In addition, all of the cell units MU (unselected cell units) in memory block MB<2> are unselected and their data is not erased.

Specifically, as shown in FIG. 6, in memory block MB<1>, a voltage of the bit line BL<1> is set to a voltage Vera, and a voltage of the drain side select transistors SDTr is set to a voltage Vera-Δ. In addition, in memory block MB<1>, a voltage of the source line SL<1> is set to the voltage Vera, and a voltage of the source side select transistors SSTr is set to the voltage Vera-Δ. That is, in memory block MB<1>, the voltage of the bit line BL<1> is set to a voltage higher than the voltage of the gates of the drain side select transistors SDTr by an amount of a voltage Δ, and the voltage of the source line SL<1> is set to a voltage higher than the voltage of the gates of the source side select transistors SSTr by an amount of the voltage Δ. This causes a GIDL current to be generated in a vicinity of gates of the source side select transistors SSTr and drain side select transistors SDTr in memory block MB<1>.

In addition, as shown in FIG. 6, in memory block MB<1>, a voltage of gates of the dummy memory transistors DMTr1, DMTr3 is set to a power supply voltage Vdd, and a voltage of gates of the dummy memory transistors DMTr2, DMTr4 is set to a ground voltage (0 V). This causes a potential of the body of the dummy memory transistors DMTr1-DMTr4 to be structured having a plurality of potential wells (potential barriers). As a result of this potential structure, the dummy memory string DMS allows movement of holes from the drain side select transistor SDTr to the memory string MS, while at the same time prohibiting movement of electrons from the drain side select transistor SDTr to the memory string MS. In memory block MB<1>, holes generated by the GIDL current in the vicinity of gates of the drain side select transistors SDTr flow into the body of the memory transistors MTr1-MTr4, thereby causing a voltage of the body of the memory transistors MTr1-MTr4 to rise.

Subsequently, the voltage of the gates of the memory transistors MTr1-MTr4 is set to 0 V, that is, is set lower than the voltage of the body of the memory transistors MTr1-MTr4. This causes a high voltage to be applied to the charge storage layer of the memory transistors MTr1-MTr4 in memory block MB<1>, whereby the erase operation on memory block MB<1> is executed.

On the other hand, in memory block MB<2>, a voltage of gates of the drain side select transistors SDTr is set to the voltage Vera. That is, the voltage of the bit line BL<1> is set to the same voltage Vera as the voltage of the gates of the drain side select transistors SDTr. In addition, the source line SL<2> is set to 0 V, and the voltage of the gates of the source side select transistors SSTr is set to a voltage Vth. That is, the voltage (Vth) of the gates of the source side select transistors SSTr is set higher than the voltage (0 V) of the source line SL<2> by an amount of the voltage Vth. As a result, in memory block MB<2>, generation of a GIDL current is prohibited, and the source side select transistors SSTr attain a conductive state.

Now, gates of the memory transistors MTr1-MTr4 are shared between memory blocks MB<1>, MB<2> due to the word lines WL1-WL4. Accordingly, the voltage of gates of the memory transistors MTr1-MTr4 is set to 0 V not only in memory block MB<1>, but also in memory block MB<2>.

However, in memory block MB<2>, the voltage of the body of the memory transistors MTr1-MTr4 is not boosted by the GIDL current. Moreover, even supposing that some kind of leak current flowed into the body of the cell units MU in memory block MB<2>, the source side select transistors SSTr in memory block MB<2> are in the conductive state, hence charge retained in the body of the memory transistors MTr1-MTr4 due to such a leak current is discharged to the source line SL<2>.

Furthermore, gates of the dummy memory transistors DMTr1-DMTr4 are shared between memory blocks MB<1>, MB<2> due to the dummy word lines DWL1-DWL4. Accordingly, even in memory block MB<2>, the dummy memory string DMS allows movement of holes from the drain side select transistor SDTr to the memory string MS, and, moreover, prohibits movement of electrons from the drain side select transistor SDTr to the memory string MS.

Therefore, in memory block MB<2>, the body of the memory transistors MTr1-MTr4 does not have electrons injected therein from the drain side select transistors SDTr. That is, leak current flowing from the bit line BL<1> into memory block MB<2> is suppressed. As a result, in memory block MB<2>, voltage rise in the body of the memory transistors MTr1-MTr4 is suppressed.

As is clear from the above, in memory block MB<2>, the voltage of the body of the memory transistors MTr1-MTr4 is held at a low voltage. Accordingly, a high voltage is not applied to the charge storage layer of those memory transistors MTr1-MTr4, hence, in the first embodiment, erase error in the unselected memory block MB<2> can be suppressed.

Figure 7:
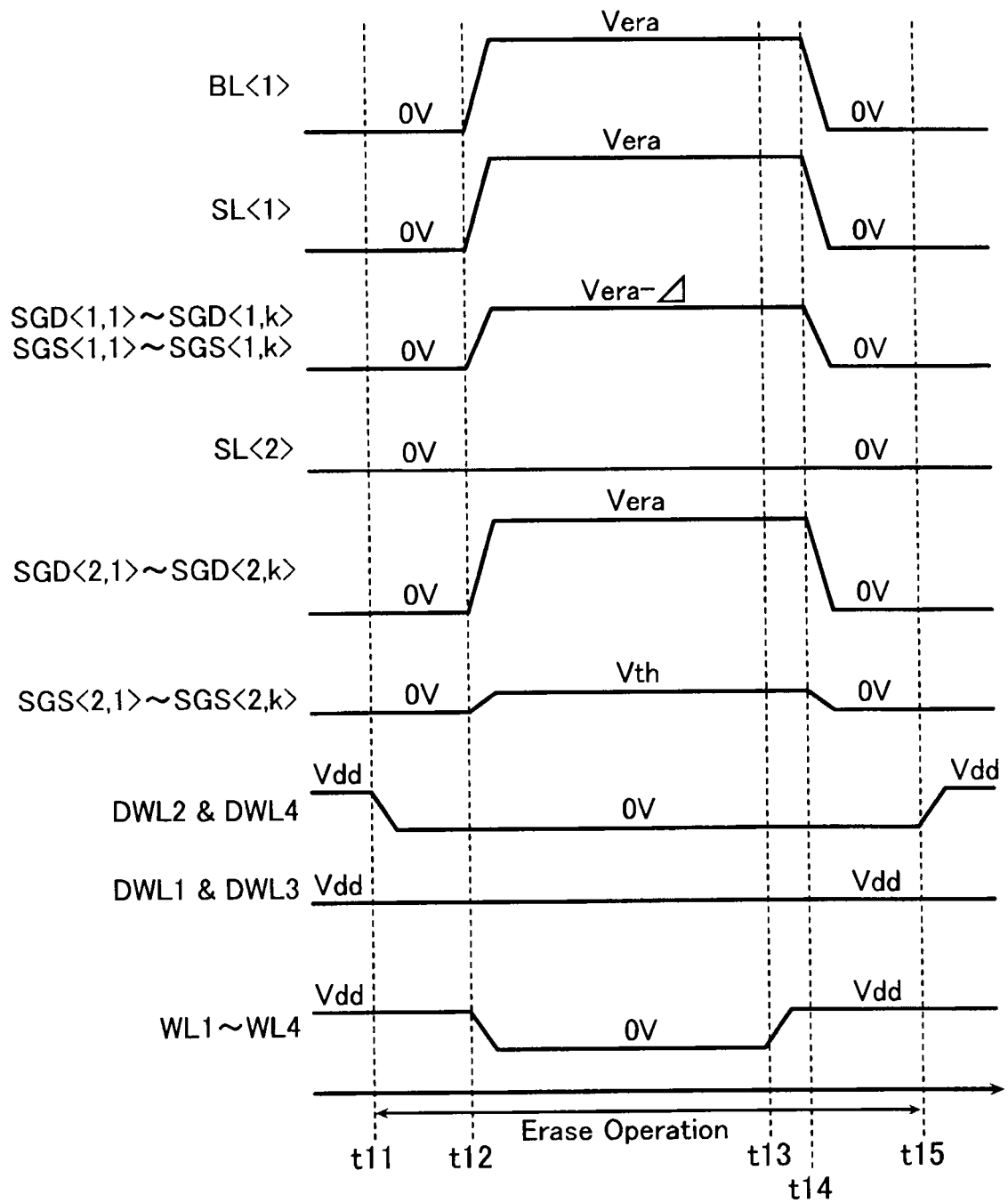
FIG. 7 is a timing chart of during the erase operation in the nonvolatile semiconductor memory device according to the first embodiment.

When executing the above-described erase operation, first, at time t11 in FIG. 7, the voltage of the dummy word lines DWL2, DWL4 is lowered from the power supply voltage Vdd to the ground voltage (0 V). Meanwhile, the voltage of the dummy word lines DWL1, DWL3 is held at the power supply voltage Vdd. As a result, the potential of the body of the dummy memory transistors DMTr1-DMTr4 configures the above-mentioned plurality of potential wells (potential barriers).

Next, at time t12, the voltage of the bit line BL<1> is raised to the voltage Vera. The voltage of the source line SL<1> is raised to the voltage Vera, while the voltage of the source line SL<2> is held at the ground voltage (0 V). The voltage of the word lines WL1-WL4 is lowered to the ground voltage (0 V). Additionally, at time t12, the voltage of the source side select gate lines SGS<1,1>-SGS<1,k> and the drain side select gate lines SGD<1,1>-SGD<1,k> is raised to the voltage Vera-Δ. Further, at time t12, the voltage of the source side select gate lines SGS<2,1>-SGS<2,k> is raised to the voltage Vth. In addition, the voltage of the drain side select gate lines SGD<2,1>-SGD<2,k> is raised to the voltage Vera.

Subsequently, at time t13, the voltage of the word lines WL1-WL4 is raised to the power supply voltage Vdd. Next, at time t14, the voltage of the bit line BL<1>, the source line SL<1>, the source side select gate lines SGS<1,1>-SGS<1,k>, SGS<2,1>-SGS<2,k>, and the drain side select gate lines SGD<1,1>-SGD<1,k>, SGD<2,1>-SGD<2,k> is lowered to the ground voltage (0 V). Then, at time t15, the voltage of the dummy word lines DWL2-DWL4 is raised to the power supply voltage Vdd.

As described above, the control at times t11-t15 allows the first embodiment to execute the erase operation on memory block MB<1> while suppressing erase error on the memory block MB<2>, as shown in FIG. 6.

[Second Embodiment]

Next, a configuration of a nonvolatile semiconductor memory device according to a second embodiment is described. Note that in the second embodiment, configurations identical to those in the first embodiment are assigned with identical symbols to those used in the first embodiment, and a description of those configurations is omitted.

Figure 8:
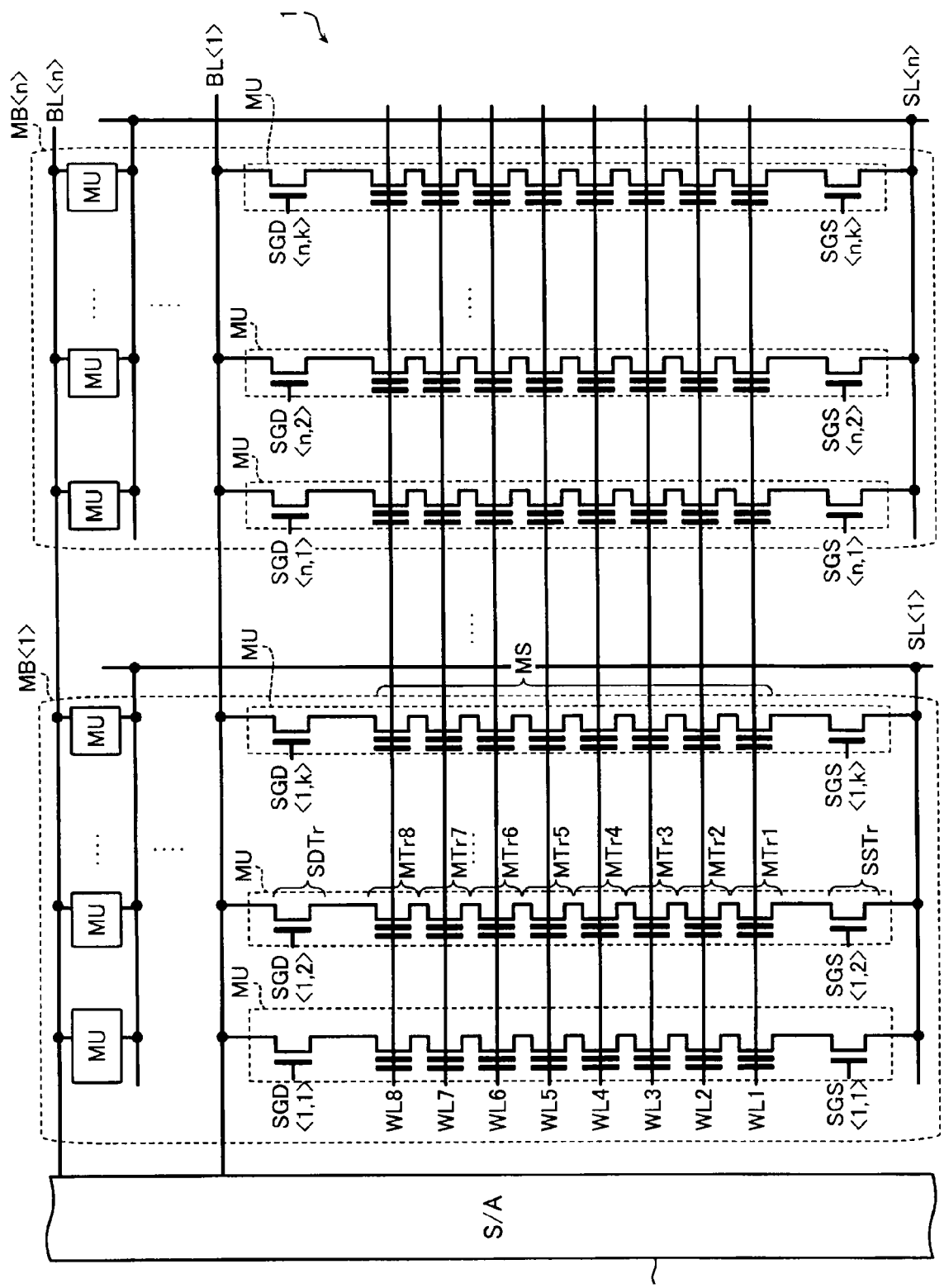
FIG. 8 is a circuit diagram of a memory cell array 1 according to a second embodiment.

FIG. 8 is a circuit diagram showing a memory cell array 1 in the second embodiment. As shown in FIG. 8, the memory cell array 1 according to the second embodiment does not include the dummy memory string DMS (dummy memory transistors DMTr1-DMTr4). On the other hand, the memory string MS further includes memory transistors MTr5-MTr8, in addition to the memory transistors MTr1-MTr4. The memory transistors MTr5-MTr8 are connected in series and provided between the memory transistor MTr4 and the drain side select transistor SDTr.

In the plurality of memory blocks MB, gates of the memory transistors MTr5-MTr8 arranged in a matrix are commonly connected to word lines WL5-WL8, respectively.

Such an above-described circuit configuration of the memory cell array 1 is realized by a similar stacking structure to that in FIGS. 3 and 4 of the first embodiment. However, in the second embodiment, the word line conductive layers 31e-31h function as the gates of the memory transistors MTr5-MTr8 and as the word lines WL5-WL8. Moreover, the memory columnar semiconductor layer 34 functions as a body (channel) of the memory transistors MTr5-MTr8.

Figure 9A:
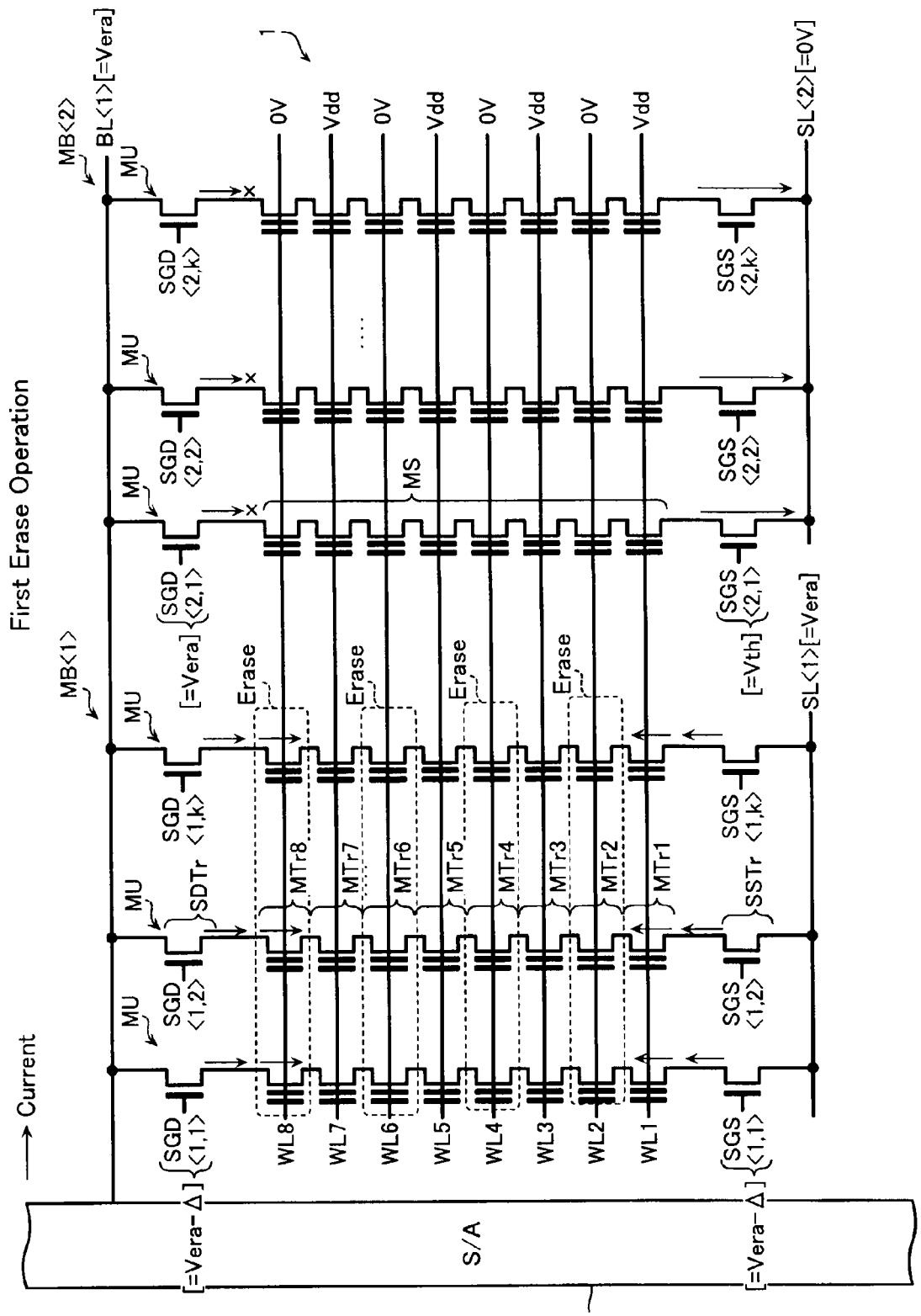
FIG. 9A is a schematic view showing an erase operation in a nonvolatile semiconductor memory device according to the second embodiment.
Figure 9B:
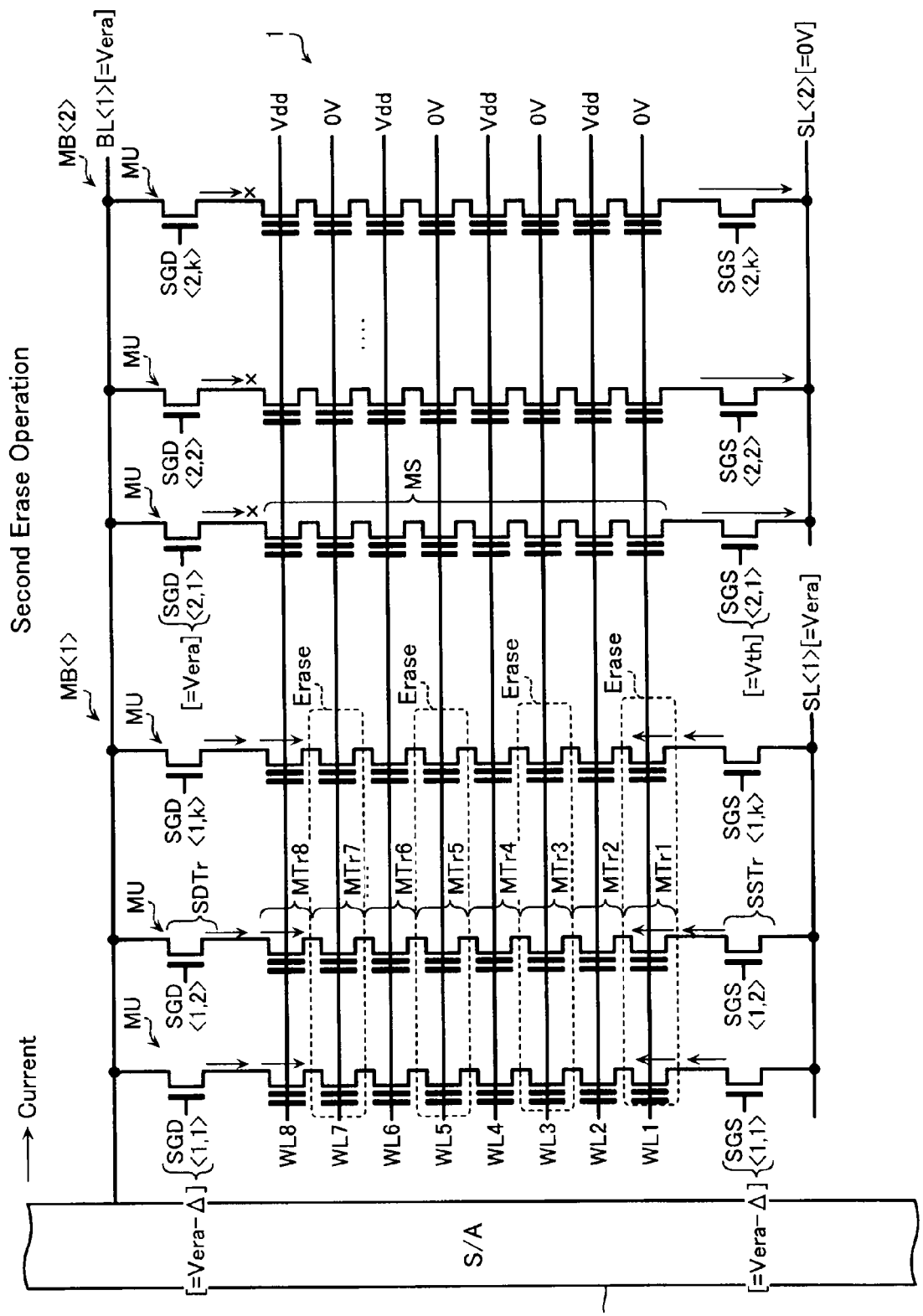
FIG. 9B is a schematic view showing the erase operation in the nonvolatile semiconductor memory device according to the second embodiment.

Next, an erase operation in the nonvolatile semiconductor memory device according to the second embodiment is described with reference to FIGS. 9A and 9B. In FIGS. 9A and 9B, description proceeds, as an example, assuming that memory block MB<1> is subject to erase, while memory block MB<2> is not selected and erase of data in the memory transistors MTr1-MTr4 in memory block MB<2> is prohibited.

During the erase operation in the second embodiment, the bit line BL<1>, the source lines SL<1>, SL<2>, the source side select transistors SSTr, and the drain side select transistors SDTr are controlled similarly to the first embodiment. During the erase operation in the second embodiment, only the memory transistors MTr1-MTr8 are subject to execution of different control to that of the first embodiment.

First, as shown in FIG. 9A, the voltage of the gates of the memory transistors MTr1, MTr3, MTr5, MTr7 is set to the power supply voltage Vdd, and the voltage of the gates of the memory transistors MTr2, MTr4, MTr6, MTr8 is set to the ground voltage (0 V).

This causes a potential of the body of the memory transistors MTr1-MTr8 to be structured having a plurality of potential wells (potential barriers). As a result of this potential structure, the memory string MS allows movement of holes from the drain side select transistor SDTr to the memory string MS. At the same time, the memory string MS prohibits movement of electrons from the drain side select transistor SDTr to the memory string MS. Therefore, in memory block MB<1>, holes generated by the GIDL current flow into the body of the memory transistors MTr1-MTr8, thereby causing a voltage of the body of the memory transistors MTr1-MTr8 to rise.

In addition, in memory block MB<1>, the gates of the memory transistors MTr2, MTr4, MTr6, MTr8 are set to the ground voltage (0 V). Accordingly, in memory block MB<1>, a high voltage is applied to the charge storage layer of the memory transistors MTr2, MTr4, MTr6, MTr8, whereby the erase operation is executed on those memory transistors MTr2, MTr4, MTr6, MTr8.

Meanwhile, also in memory block MB<2>, the memory string MS allows movement of holes from the drain side select transistor SDTr to the memory string MS, and, moreover, prohibits movement of electrons from the drain side select transistor SDTr to the memory string MS.

Therefore, in memory block MB<2>, the body of the memory transistors MTr1-MTr8 does not have electrons injected therein from the drain side select transistors SDTr. That is, leak current flowing from the bit line BL<1> into memory block MB<2> is suppressed. As a result, in memory block MB<2>, voltage rise in the body of the memory transistors MTr1-MTr8 is suppressed.

Next, as shown in FIG. 9B, the gates of the memory transistors MTr2, MTr4, MTr6, MTr8 are set to the power supply voltage Vdd, and the gates of the memory transistors MTr1, MTr3, MTr5, MTr7 are set to the ground voltage (0 V).

As a result, similarly to FIG. 9A, the memory string MS allows movement of holes from the drain side select transistor SDTr to the memory string MS. At the same time, the memory string MS prohibits movement of electrons from the drain side select transistor SDTr to the memory string MS. Therefore, in memory block MB<1>, holes generated by the GIDL current flow into the body of the memory transistors MTr1-MTr8, thereby causing a voltage of the body of the memory transistors MTr1-MTr8 to rise.

In addition, in memory block MB<1>, the gates of the memory transistors MTr1, MTr3, MTr5, MTr7 are set to the ground voltage (0 V). Accordingly, in memory block MB<1>, a high voltage is applied to the charge storage layer of the memory transistors MTr1, MTr3, MTr5, MTr7, whereby the erase operation is executed on those memory transistors MTr1, MTr3, MTr5, MTr7.

Meanwhile, also in memory block MB<2>, the memory string MS allows movement of holes from the drain side select transistor SDTr to the memory string MS, and, moreover, prohibits movement of electrons from the drain side select transistor SDTr to the memory string MS.

Therefore, in memory block MB<2>, the body of the memory transistors MTr1-MTr8 does not have electrons injected therein from the drain side select transistors SDTr. That is, leak current flowing from the bit line BL<1> into memory block MB<2> is suppressed. As a result, in memory block MB<2>, voltage rise in the body of the memory transistors MTr1-MTr8 is suppressed.

As is clear from the above, the second embodiment executes the erase operation (hereinafter, first erase operation) on the memory transistors MTr2, MTr4, MTr6, MTr8 in memory block MB<1> as shown in FIG. 9A. Subsequently, the second embodiment executes the erase operation (hereinafter, second erase operation) on the memory transistors MTr1, MTr3, MTr5, MTr7 in memory block MB<1> as shown in FIG. 9B. Moreover, during execution of the first erase operation and the second erase operation, the second embodiment suppresses leak current in memory block MB<2>, thereby suppressing occurrence of erase error in memory block MB<2>.

Figure 10:
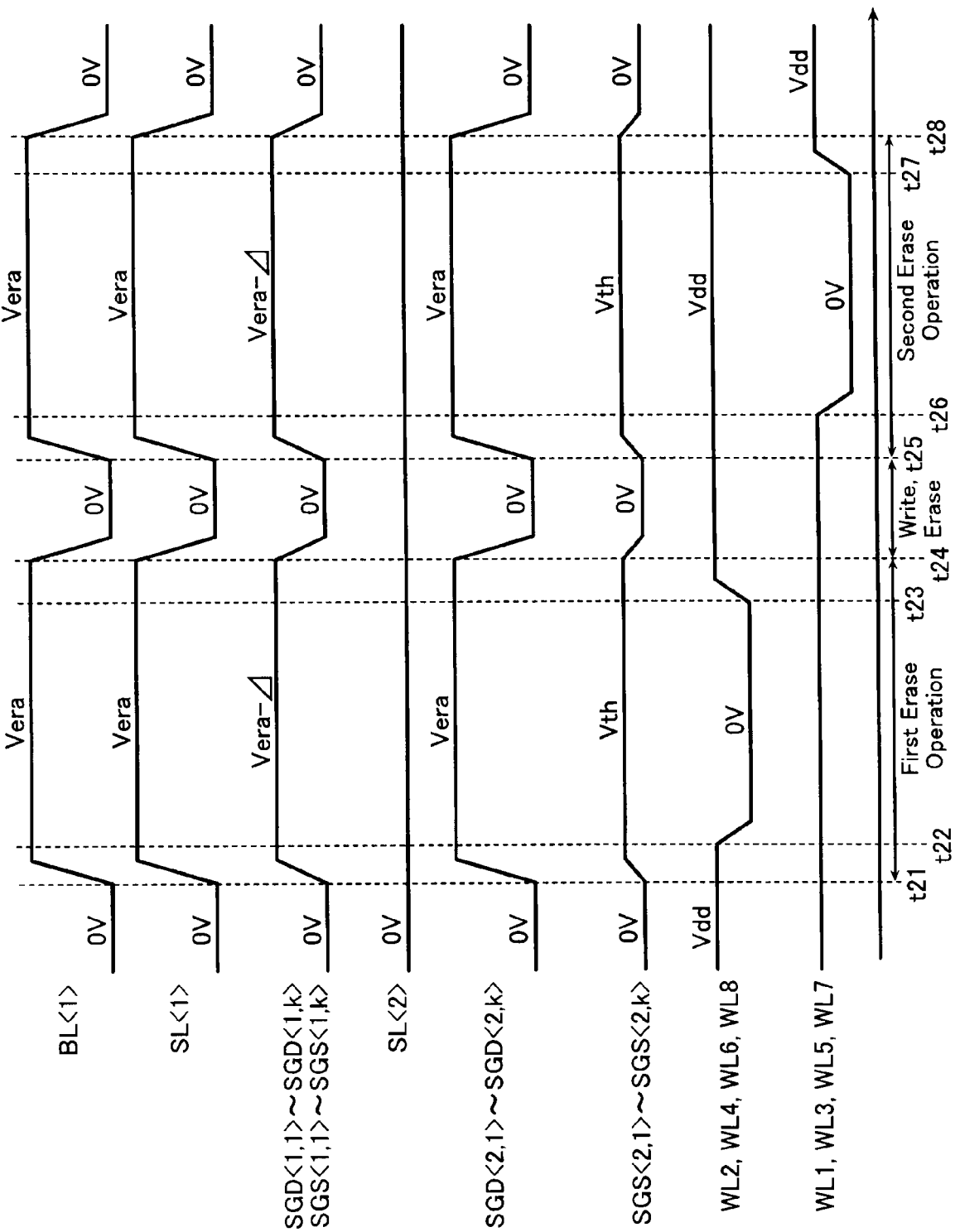
FIG. 10 is a timing chart of during the erase operation in the nonvolatile semiconductor memory device according to the second embodiment.

When executing the above-described erase operation, first, at time t21 in FIG. 10, the voltage of the bit line BL<1> is raised to the voltage Vera. The voltage of the source line SL<1> is raised to the voltage Vera, while the voltage of the source line SL<2> is held at the ground voltage (0 V).

Additionally, at time t21, the voltage of the source side select gate lines SGS<1,1>-SGS<1,k> and the drain side select gate lines SGD<1,1>-SGD<1,k> is raised to the voltage Vera-Δ.

Further, at time t21, the voltage of the source side select gate lines SGS<2,1>-SGS<2,k> is raised to the voltage Vth. In addition, the voltage of the drain side select gate lines SGD<2,1>-SGD<2,k> is raised to the voltage Vera.

Next, at time t22, the voltage of the word lines WL2, WL4, WL6, WL8 is lowered from the power supply voltage Vdd to the ground voltage (0 V). Meanwhile, the voltage of the word lines WL1, WL3, WL5, WL7 is held at the power supply voltage Vdd. As a result, the potential of the body of the memory transistors MTr1-MTr8 configures the above-mentioned potential wells (potential barriers). Then, as shown in FIG. 9A, control at these times t21, t22 results in the first erase operation on memory block MB<1> being executed, while erase error on memory block MB<2> is suppressed.

Then, at time t23, the voltage of the word lines WL2, WL4, WL6, WL8 is raised to the power supply voltage Vdd. Next, at time t24, the voltage of the bit line BL<1>, the source lines SL<1>, SL<2>, the source side select gate lines SGS<1,1>-SGS<1,k>, SGS<2,1>-SGS<2,k>, and the drain side select gate lines SGD<1,1>-SGD<1,k>, SGD<2,1>-SGD<2,k> is lowered to the ground voltage (0 V).

Next, at time t25, the voltage of the bit line BL<1> is raised to the voltage Vera. The voltage of the source line SL<1> is raised to the voltage Vera, while the voltage of the source line SL<2> is held at the ground voltage (0 V).

Additionally, at time t25, the voltage of the source side select gate lines SGS<1,1>-SGS<1,k> and the drain side select gate lines SGD<1,1>-SGD<1,k> is raised to the voltage Vera-Δ.

Further, at time t25, the voltage of the source side select gate lines SGS<2,1>-SGS<2,k> is raised to the voltage Vth. In addition, the voltage of the drain side select gate lines SGD<2,1>-SGD<2,k> is raised to the voltage Vera.

Next, at time t26, the voltage of the word lines WL1, WL3, WL5, WL7 is lowered from the power supply voltage Vdd to the ground voltage (0 V). Meanwhile, the voltage of the word lines WL2, WL4, WL6, WL8 is held at the power supply voltage Vdd. As a result, the potential of the body of the memory transistors MTr1-MTr8 configures the above-mentioned potential wells (potential barriers). Then, as shown in FIG. 9B, control at these times t25, t26 results in the second erase operation on memory block MB<1> being executed, while erase error on memory block MB<2> is suppressed.

Then, at time t27, the voltage of the word lines WL1, WL3, WL5, WL7 is raised to the power supply voltage Vdd. Next, at time t28, the voltage of the bit line BL<1>, the source lines SL<1>, SL<2>, the source side select gate lines SGS<1,1>-SGS<1,k>, SGS<2,1>-SGS<2,k>, and the drain side select gate lines SGD<1,1>-SGD<1,k>, SGD<2,1>-SGD<2,k> is lowered to the ground voltage (0 V).

As shown in FIG. 10, the first erase operation is executed at times t21-t24, and then the second erase operation is executed at times t25-t28. That is, after completion of the first erase operation, interval times t24-t25 is inserted, and the second erase operation is executed. Therefore, the second embodiment is configured such that a write operation, read operation, or the like, other than the erase operation, is executable in the interval times t24-t25. As a result, increase in operation time is suppressed in the second embodiment.

[Third Embodiment]

Next, a stacking structure of a nonvolatile semiconductor memory device according to a third embodiment is described. Note that in the third embodiment, configurations identical to those in the first and second embodiments are assigned with identical symbols to those used in the first and second embodiments, and a description of those configurations is omitted.

Figure 11:
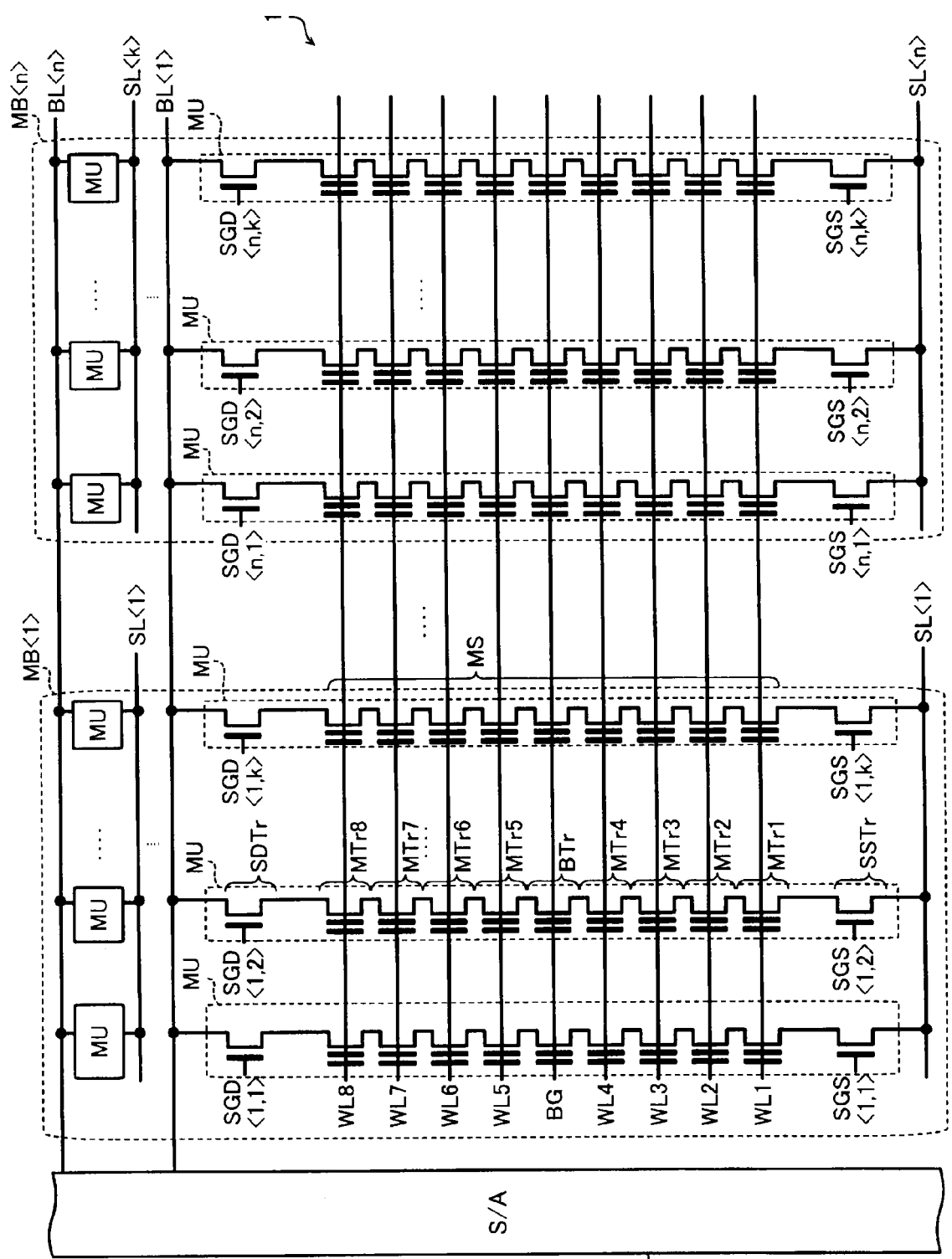
FIG. 11 is a circuit diagram of a memory cell array 1 according to a third embodiment.

FIG. 11 is a circuit diagram showing a memory cell array 1 in the third embodiment. As shown in FIG. 11, the memory string MS according to the third embodiment further includes a back gate transistor BTr between the memory transistor MTr4 and the memory transistor MTr5, in addition to the configuration of the second embodiment. In the plurality of memory blocks MB, gates of the back gate transistors BTr arranged in a matrix are commonly connected to a back gate line BG.

Figure 12:
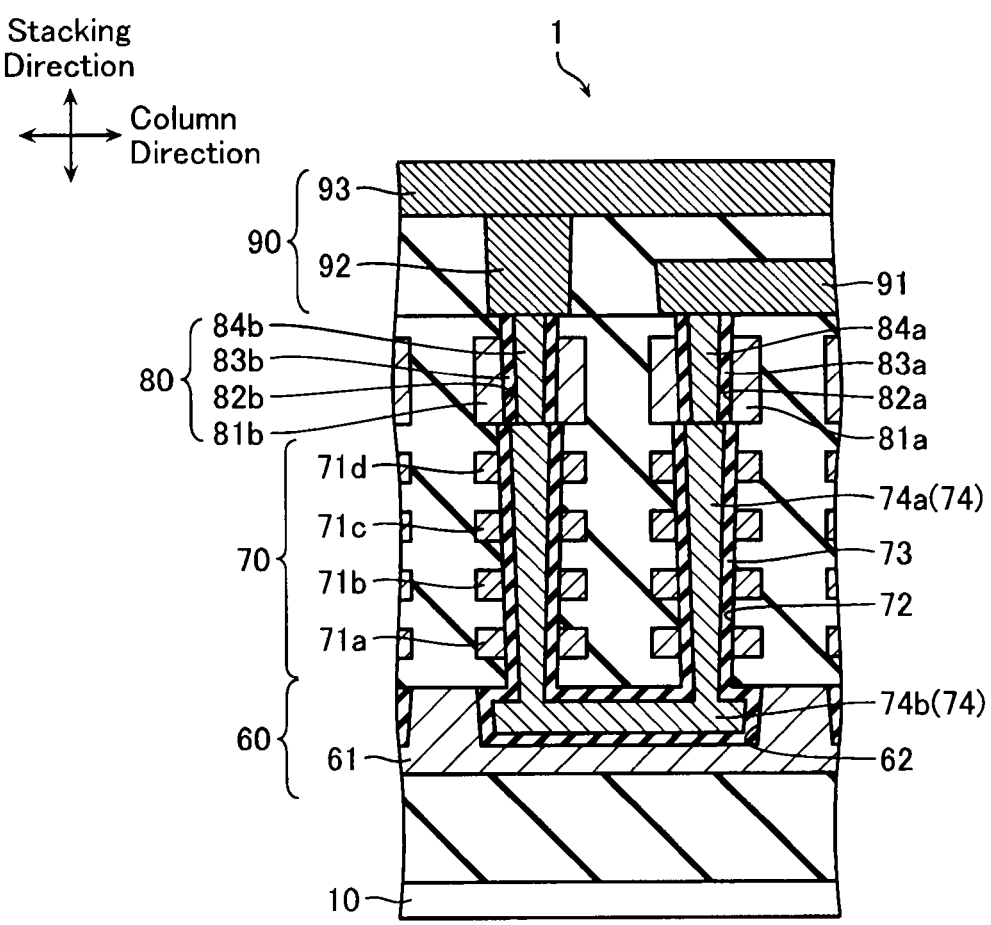
FIG. 12 is a cross-sectional view of a nonvolatile semiconductor memory device according to the third embodiment.

Such an above-described circuit configuration of the memory cell array 1 is realized by a stacking structure shown in FIG. 12. That is, as shown in FIG. 12, the nonvolatile semiconductor memory device according to the third embodiment includes, stacked sequentially on the semiconductor substrate 10, a back gate layer 60, a memory layer 70, a select transistor layer 80, and a wiring layer 90. The back gate layer 60 functions as the back gate transistor BTr. The memory layer 70 functions as the memory string MS (memory transistors MTr1-MTr8). The select transistor layer 80 functions as the drain side select transistor SDTr and the source side select transistor SSTr. The wiring layer 90 functions as the source line SL and the bit line BL.

As shown in FIG. 12, the back gate layer 60 includes a back gate conductive layer 61. The back gate conductive layer 61 is formed so as to spread two-dimensionally in the row direction and the column direction parallel to the substrate 10. The back gate layer 60 is configured by polysilicon (poly-Si).

As shown in FIG. 12, the back gate conductive layer 61 includes a back gate hole 62. The back gate hole 62 is formed so as to dig out the back gate conductive layer 61. The back gate hole 62 is formed in a substantially rectangular shape having the column direction as a longer direction as viewed from an upper surface. The back gate holes 62 are formed in a matrix in the row direction and the column direction.

As shown in FIG. 12, the memory layer 70 is formed in a layer above the back gate layer 60. The memory layer 70 includes word line conductive layers 71a-71d. The word line conductive layer 71a functions as the word line WL4 and as the gate of the memory transistor MTr4. In addition, the word line conductive layer 71a functions as the word line WL5 and as the gate of the memory transistor MTr5. The word line conductive layer 71b functions as the word line WL3 and as the gate of the memory transistor MTr3. In addition, the word line conductive layer 71b functions as the word line WL6 and as the gate of the memory transistor MTr6. The word line conductive layer 71c functions as the word line WL2 and as the gate of the memory transistor MTr2. In addition, the word line conductive layer 71c functions as the word line WL7 and as the gate of the memory transistor MTr7. The word line conductive layer 71d functions as the word line WL1 and as the gate of the memory transistor MTr1. In addition, the word line conductive layer 71d functions as the word line WL8 and as the gate of the memory transistor MTr8.

The word line conductive layers 71a-71d are stacked sandwiching insulating layers. The word line conductive layers 71a-71d are formed extending in the row direction as a longer direction and having a certain pitch in the column direction. The word line conductive layers 71a-71d are configured by polysilicon (poly-Si).

As shown in FIG. 12, the memory layer 70 includes a memory hole 72. The memory hole 72 is formed penetrating the word line conductive layers 71a-71d and the insulating layers. The memory hole 72 is formed aligning with a vicinity of an end portion of the back gate hole 62 in the column direction.

Moreover, as shown in FIG. 12, the back gate layer 60 and the memory layer 70 include a memory gate insulating layer 73 and a memory semiconductor layer 74. The memory semiconductor layer 74 functions as a body of the memory transistors MTr1-MTr8 (memory string MS). The memory gate insulating layer 73 includes a charge storage layer for storing a charge, similarly to the above-described embodiments.

The memory semiconductor layer 74 is formed so as to fill the back gate hole 62 and the memory hole 72. The memory semiconductor layer 74 is formed in a U shape as viewed from the row direction. The memory semiconductor layer 74 includes a pair of columnar portions 74a extending in the perpendicular direction to the substrate 10, and a joining portion 74b configured to join lower ends of the pair of columnar portions 74a. The memory semiconductor layer 74 is configured by polysilicon (poly-Si).

Expressing the above-described configuration of the back gate layer 60 in other words, the back gate conductive layer 61 is formed to surround the joining portion 74b via the memory gate insulating layer 73. In addition, expressing the above-described configuration of the memory layer 70 in other words, the word line conductive layers 71a-71d are formed to surround the columnar portions 74a via the memory gate insulating layer 73.

As shown in FIG. 12, the select transistor layer 80 includes a source side conductive layer 81a and a drain side conductive layer 81b. The source side conductive layer 81a functions as the source side select gate line SGS and as the gate of the source side select transistor SSTr. The drain side conductive layer 81b functions as the drain side select gate line SGD and as the gate of the drain side select transistor SDTr.

The source side conductive layer 81a is formed in a layer above one of the columnar portions 74a configuring the memory semiconductor layer 74, and the drain side conductive layer 81b which is in the same layer as the source side conductive layer 81a is formed in a layer above the other of the columnar portions 74a configuring the memory semiconductor layer 74. The source side conductive layer 81a and the drain side conductive layer 81b are formed in stripes extending in the row direction and having a certain pitch in the column direction. The source side conductive layer 81a and the drain side conductive layer 81b are configured by polysilicon (poly-Si).

As shown in FIG. 12, the select transistor layer 80 includes a source side hole 82a and a drain side hole 82b. The source side hole 82a is formed penetrating the source side conductive layer 81a. The drain side hole 82b is formed penetrating the drain side conductive layer 81b. The source side hole 82a and the drain side hole 82b are each formed at a position aligning with the memory hole 72.

As shown in FIG. 12, the select transistor layer 80 includes a source side gate insulating layer 83a, a source side columnar semiconductor layer 84a, a drain side gate insulating layer 83b, and a drain side columnar semiconductor layer 84b. The source side columnar semiconductor layer 84a functions as a body of the source side select transistor SSTr. The drain side columnar semiconductor layer 84b functions as a body of the drain side select transistor SDTr.

The source side gate insulating layer 83a is formed with a certain thickness on a side surface of the source side hole 82a. The source side columnar semiconductor layer 84a is formed in a column shape to be in contact with a side surface of the source side gate insulating layer 83a and an upper surface of one of the pair of columnar portions 74a and to extend in the perpendicular direction to the substrate 10. The source side columnar semiconductor layer 84a is configured by polysilicon (poly-Si).

The drain side gate insulating layer 83b is formed with a certain thickness on a side surface of the drain side hole 82b. The drain side columnar semiconductor layer 84b is formed in a column shape to be in contact with a side surface of the drain side gate insulating layer 83b and an upper surface of the other of the pair of columnar portions 74a and to extend in the perpendicular direction to the substrate 10. The drain side columnar semiconductor layer 84b is configured by polysilicon (poly-Si).

The wiring layer 90 includes a source layer 91, a plug layer 92, and a bit layer 93. The source layer 91 functions as the source line SL. The bit layer 93 functions as the bit line BL.

The source layer 91 is formed to be in contact with an upper surface of the source side columnar semiconductor layer 84*a* and to extend in the row direction. The bit layer 93 is formed to be in contact with an upper surface of the drain side columnar semiconductor layer 84*b* via the plug layer 92 and to extend in the column direction. The source layer 91, the plug layer 92, and the bit layer 93 are configured by a metal such as tungsten. This allows the source line SL to be made more low resistance than in the first and second embodiments.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 13:
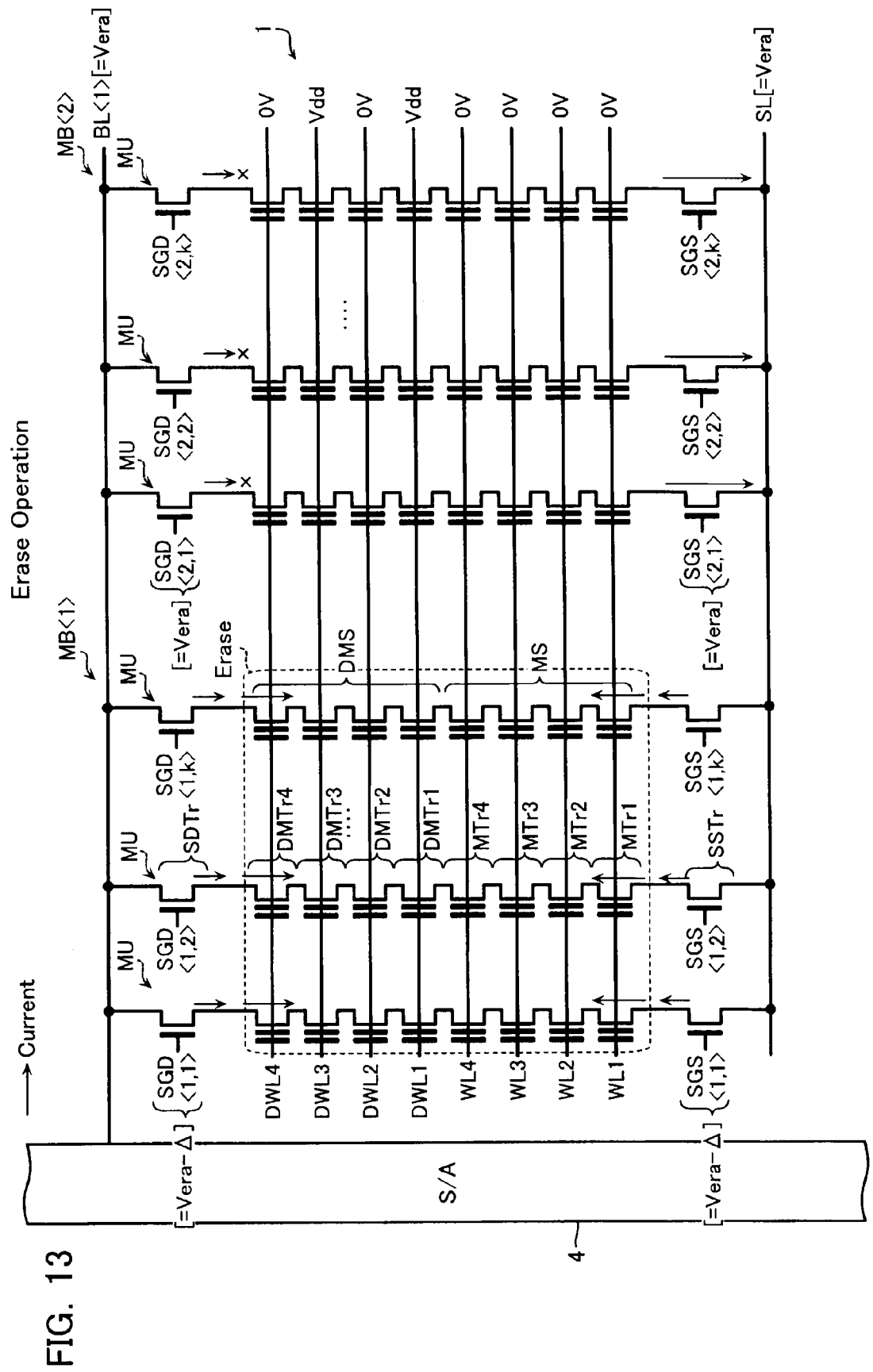
FIG. 13 is a schematic view showing an erase operation in a nonvolatile semiconductor memory device according to another embodiment.

For example, the source lines SL<1>, ..., SL<n> according to the first through third embodiments are divided on a memory block MB<1>, ..., MB<n> basis. However, as shown in FIG. 13, a source line SL may be commonly provided to the memory blocks MB<1>, ..., MB<n>. In this case, during the erase operation, the source line SL is applied with the voltage Vera, and the gates of the source side select transistors SSTr included in the unselected memory block MB<2> are applied with the voltage Vera.

Figure 14:
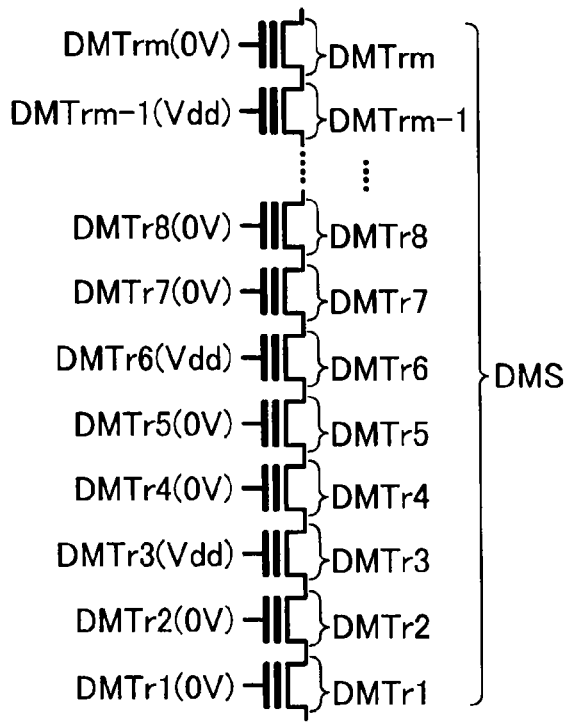
FIG. 14 is a circuit diagram showing a dummy memory string DMS in a nonvolatile semiconductor memory device according to a modified example.

In addition, as a modified example of the first embodiment, the dummy memory string DMS may include m dummy memory transistors DMTr1-DMTrm, as shown in FIG. 14. In this case, for example, gates of the 3i-th dummy memory transistors DMTr3, DMTr6, ... may be set to the power supply voltage Vdd, and gates of the other dummy memory transistors DMTr1, DMTr2, DMTr4, DMTr5, DMTr7 may be applied with the ground voltage (0 V). That is, the modified example of the first embodiment may be configured such that, during the erase operation, in selected cell units MU and unselected cell units MU, the gate of at least one dummy memory transistor DMTr in the dummy memory string DMS is applied with the power supply voltage Vdd, and the gates of another dummy memory transistors DMTr in the dummy memory string DMS are applied with the ground voltage (0 V) which is lower than the power supply voltage Vdd.

Figure 15:
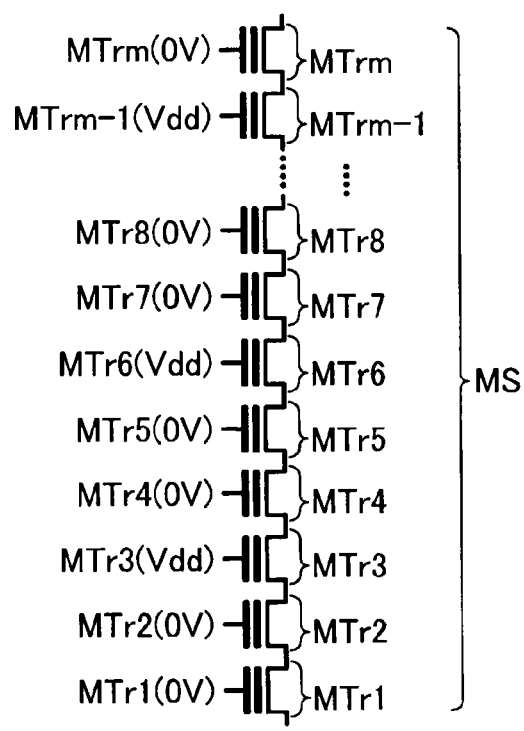
FIG. 15 is a circuit diagram showing a memory string MS in a nonvolatile semiconductor memory device according to a modified example.

Moreover, as a modified example of the second embodiment, the memory string MS may include m memory transistors MTr1-MTrm, as shown in FIG. 15. In this case, for example, gates of the 3i-th memory transistors MTr3, MTr6, ... may be set to the power supply voltage Vdd, and gates of the other memory transistors MTr1, MTr2, MTr4, MTr5, MTr7 may be applied with the ground voltage (0 V). That is, the modified example of the second embodiment may be configured such that, during the erase operation, in selected cell units MU and unselected cell units MU, the gate of at least one memory transistor MTr in the memory string MS is applied with the power supply voltage Vdd, and the gates of another memory transistors MTr in the memory string MS are applied with the ground voltage (0 V) which is lower than the power supply voltage Vdd.

What is claimed is:

1. A nonvolatile semiconductor memory device comprising:
    a plurality of memory blocks, one of the memory blocks including a first group and a second group, the first group including a first unit and a second unit, the first group electrically connected to a first bit line, the second group electrically connected to a second bit line, the first unit including a first memory cell and a second memory cell, the second unit including a third memory cell and a fourth memory cell;
    a first line electrically connected to one end of the first unit;
    a second line electrically connected to one end of the second unit;
    a third line electrically connected to gates of the first memory cell and the third memory cell;
    a fourth line electrically connected to gates of the second memory cell and the fourth memory cell; and
    a controller configured to perform an erase operation on the condition that a first voltage is applied to the first line, a second voltage is applied to the second line, a third voltage is applied to the third line, a fourth voltage is applied to the fourth line, the second voltage is higher than the first voltage, and the fourth voltage is higher than the third voltage.

2. The device according to claim 1, wherein the fourth voltage is a positive voltage.

3. The device according to claim 1, wherein the third voltage is substantially zero voltage.

4. The device according to claim 1, wherein the first unit includes a first dummy cell, the second unit includes a second dummy cell, and a gate of the first dummy cell is electrically connected to a gate of the second dummy cell.

5. The device according to claim 1, wherein a period in which the first voltage is applied to the first line and the second voltage is applied to the second line overlaps a period in which the third voltage is applied to the third line and the fourth voltage is applied to the fourth line.

6. The device according to claim 4, wherein the first dummy cell is disposed between the first memory cell and the second memory cell and the second dummy cell is disposed between the third memory cell and the fourth memory cell.

7. A nonvolatile semiconductor memory device comprising:
    a first memory string including a first memory cell, a second memory cell, a first selection transistor and a second selection transistor;
    a second memory string including a third memory cell, a fourth memory cell, a third selection transistor and a fourth selection transistor;
    a first word line electrically connected to a gate of the first memory cell and a gate of the third memory cell;
    a second word line electrically connected to a gate of the second memory cell and a gate of the fourth memory cell;
    a first line electrically connected to a first end of the first memory string and a first end of the second memory string;
    a second line electrically connected to a second end of the first memory string;
    a third line electrically connected to a second end of the second memory string; and
    a controller configured to perform an erase operation for at least the first memory cell and the third memory cell on the condition that a first voltage is applied to the first word line, a second voltage is applied to the second word line, a third voltage is applied to the second line, a fourth voltage is applied to the third line, a fifth voltage is applied to a gate of the first selection transistor, a sixth voltage is applied to a gate of the second selection transistor, the first voltage is lower than the second voltage, the third voltage is different from the fourth voltage and the fifth voltage is different from the sixth voltage.

8. The device according to claim 7, wherein the first word line is a selected word line and the second word line is an unselected word line.

9. The device according to claim 7, wherein the first voltage is substantially zero voltage.

10. The device according to claim 9, wherein the second voltage is substantially Vdd voltage.

11. The device according to claim 7, further comprising:
- a third memory string including a fifth memory cell and a sixth memory cell;
- a fourth memory string including a seventh memory cell and an eighth memory cell;
- a fourth line electrically connected to a first end of the third memory string and a first end of the fourth memory string.

12. The device according to claim 11, wherein a second end of the third memory string is electrically connected to the second line and a second end of the fourth memory string is electrically connected to the third line.

13. The device according to claim 9, further comprising:
- a third memory string including a fifth memory cell and a sixth memory cell;
- a fourth memory string including a seventh memory cell and an eighth memory cell;
- a fourth line electrically connected to a first end of the third memory string and a first end of the fourth memory string.

14. The device according to claim 13, wherein a second end of the third memory string is electrically connected to the second line and a second end of the fourth memory string is electrically connected to the third line.

* * * * *